(12) United States Patent
Kobayashi et al.

(10) Patent No.: US 9,067,406 B2
(45) Date of Patent: Jun. 30, 2015

(54) SCREEN PRINTER

(75) Inventors: Hiroki Kobayashi, Yamanashi (JP);
Toshiyuki Murakami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/818,435

(22) PCT Filed: Sep. 11, 2012

(86) PCT No.: PCT/JP2012/005769
§ 371 (c)(1),
(2), (4) Date: Feb. 22, 2013

(87) PCT Pub. No.: WO2013/088607
PCT Pub. Date: Jun. 20, 2013

(65) Prior Publication Data
US 2013/0239829 A1    Sep. 19, 2013

(30) Foreign Application Priority Data

Dec. 16, 2011 (JP) .................................. 2011-275406

(51) Int. Cl.
*B41F 15/08* (2006.01)
*B41F 15/44* (2006.01)
(Continued)

(52) U.S. Cl.
CPC ................. *B41F 15/44* (2013.01); *B41F 15/40* (2013.01); *B41M 1/12* (2013.01); *H05K 3/1216* (2013.01); *B41F 15/42* (2013.01); *H05K 3/1233* (2013.01); *H05K 3/3484* (2013.01); *B41F 15/0881* (2013.01); *B41F 15/36* (2013.01); *B41F 15/423* (2013.01); *B41P 2215/50* (2013.01)

(58) Field of Classification Search
CPC .......... B41F 15/08; B41F 15/40; B41F 15/44; B41F 15/0818; B41F 15/423; H05K 3/1216; H05K 3/1225; H05K 3/1233; H05K 2203/0126; H05K 2203/0139
USPC .......................... 101/123, 126, 127, 129, 114
See application file for complete search history.

(56) References Cited

U.S. PATENT DOCUMENTS 6,453,810 B1 * 9/2002 Rossmeisl et al. ............ 101/123
2011/0132212 A1   6/2011 Kondo et al.

FOREIGN PATENT DOCUMENTS

| CN | 201432461 Y | 3/2010 |
| CN | 102152605 A | 8/2011 |

(Continued)

OTHER PUBLICATIONS

International Search Report for PCT/JP2012/005769 dated Oct. 16, 2012.

(Continued)

*Primary Examiner* — Blake A Tankersley
*Assistant Examiner* — Marissa Ferguson Samreth
(74) *Attorney, Agent, or Firm* — Pearne & Gordon LLP

(57) ABSTRACT

A pressing mechanism that presses a dam member 30 against a screen mask 12 has a guide shaft 32 that guides a direction of movement of the dam member 30 during pressing operation and a compression spring 33 that forces the dam member 30 in an axial direction of the guide shaft 32. A printing pressure value at which the dam member 30 is pressed against the screen mask 12 is made stable, to thus make stable an effect of preventing effluence of the paste to the outside of a print width on the screen mask 12.

5 Claims, 9 Drawing Sheets

(51) Int. Cl.
  *H05K 3/12* (2006.01)
  *H05K 3/34* (2006.01)
  *B41M 1/12* (2006.01)
  *B41F 15/42* (2006.01)
  *B41F 15/36* (2006.01)
  *B41F 15/40* (2006.01)

(56) References Cited

FOREIGN PATENT DOCUMENTS

| CN | 202053666 U | 11/2011 |
| JP | 04-189142 A | 7/1992 |
| JP | 05-016326 A | 1/1993 |
| JP | 06-039999 A | 2/1994 |
| JP | 06-42168 U | 6/1994 |
| JP | 2003-220687 A | 8/2003 |
| JP | 2004-034638 A | 2/2004 |
| JP | 2004-338139 A | 12/2004 |

OTHER PUBLICATIONS

CN Office Action—Search Report for CN Patent Application No. 201280002597.2 dated Dec. 23, 2014.

* cited by examiner (a)

(b)

SCREEN PRINTER

TECHNICAL FIELD

The present invention relates to a screen printer that prints a substrate with paste, like cream solder and conductive paste.

BACKGROUND ART

Screen printing has hitherto been employed in an electronic component mounting process as a method for printing a substrate with paste, like cream solder and conductive paste. The method includes setting on a substrate a screen mask which has pattern holes aligned to locations of print targets and slidably moving a squeegee over the screen mask supplied with paste, thereby printing the substrate with the paste through the pattern holes. During screen printing, the paste supplied over the screen mask is scraped up with the squeegee, to thus be supplied over an entire print width of the substrate. During squeegeeing, the paste is scraped up in a direction of movement of the squeegee, being gradually shoved outside along a surface of the squeegee. Since the paste dislodged outside the width of the substrate stays behind without being scraped up by the squeegee and is susceptible to flection because an area of the screen mask located outside the width of the substrate is not supported from below, the paste acts as impediments to normal squeegeeing action.

In order to prevent occurrence of such a problem, a known screen printer (see; for instance Patent Document 1) has dam members that are provided on a squeegee while spaced apart from each other at a interval equal to a print width of a substrate and exhibits a function of preventing paste on a screen mask from being shoved outside the print width. According to the related art described in connection with the patent document, the dam members are pressed against the squeegee and the screen mask, thereby regulating effluence of the paste during squeegeeing operation.

RELATED ART DOCUMENT

Patent Document

Patent Document 1: JP-A-2004-34638

SUMMARY OF THE PRESENT INVENTION

Problem that the Present Invention is to Solve

The related art described in connection with the patent document, however, presents problems to be described below because of a way to press the dam members. Specifically, in the related art, the dam members are configured so as to be separately pressed with two compression springs that are provided in a vertical direction with respect to the squeegee and in a mutually-orthogonal direction with respect to an upper surface of the screen mask. Because of the configuration, a printing pressure value at which the squeegee presses the screen mask during screen printing operation varies under influence of pressing force that acts on the squeegee at right angles, which poses difficulty in assuring a stable printing pressure value. A press value at which the dam members are pressed against the screen mask also becomes unstable for reasons of mutual interference between pressing forces of the two compression springs, so that an effect of preventing occurrence of a runoff of paste is unstable and insufficient.

Accordingly, the present invention aims at providing a screen printer capable of stably exhibiting an effect of preventing effluence of paste outside a print width on a screen mask.

Means for Solving the Problem

A screen printer that brings a substrate into contact with a screen mask having a pattern hole and prints the substrate with paste through the pattern hole by squeegeeing operation for supplying the paste over the screen mask and sliding a squeegee, the screen printer comprising: a substrate positioning section that holds and positions the substrate with respect to the screen mask; a screen printing mechanism that vertically and horizontally moves a squeegee head having the squeegee, thereby performing the squeegeeing operation; and a dam member that is provided on the squeegee head at an interval according to a print width of the substrate in a direction in which the squeegee proceeds during the squeegeeing operation and that contacts an upper surface of the screen mask and the squeegee, thereby preventing effluence of the paste to the outside of the print width on the screen mask; and a pressing mechanism that presses the dam member against the screen mask, wherein the pressing mechanism has a guide shaft placed in parallel to the corresponding squeegee and guides a direction of movement of the corresponding dam member during pressing operation and a forcing unit that forces the corresponding dam member in an axial direction of the corresponding guide shaft.

Advantage of the Present Invention

According to the present invention, a pressing mechanism that presses against a screen mask a dam member which prevents effluence of paste to the outside of a print width on the screen mask has a guide shaft that is placed in parallel to a corresponding squeegee and that guides a direction of movement of the dam member during pressing operation and a forcing unit that forces the dam member in an axial direction of the guide shaft. A printing pressure value at which the dam member is pressed against the screen mask is thereby made stable, so that an effect of preventing effluence of the paste to the outside of a print width on the screen mask can be made stable.

EMBODIMENT FOR IMPLEMENTING THE PRESENT INVENTION

Figure 1:
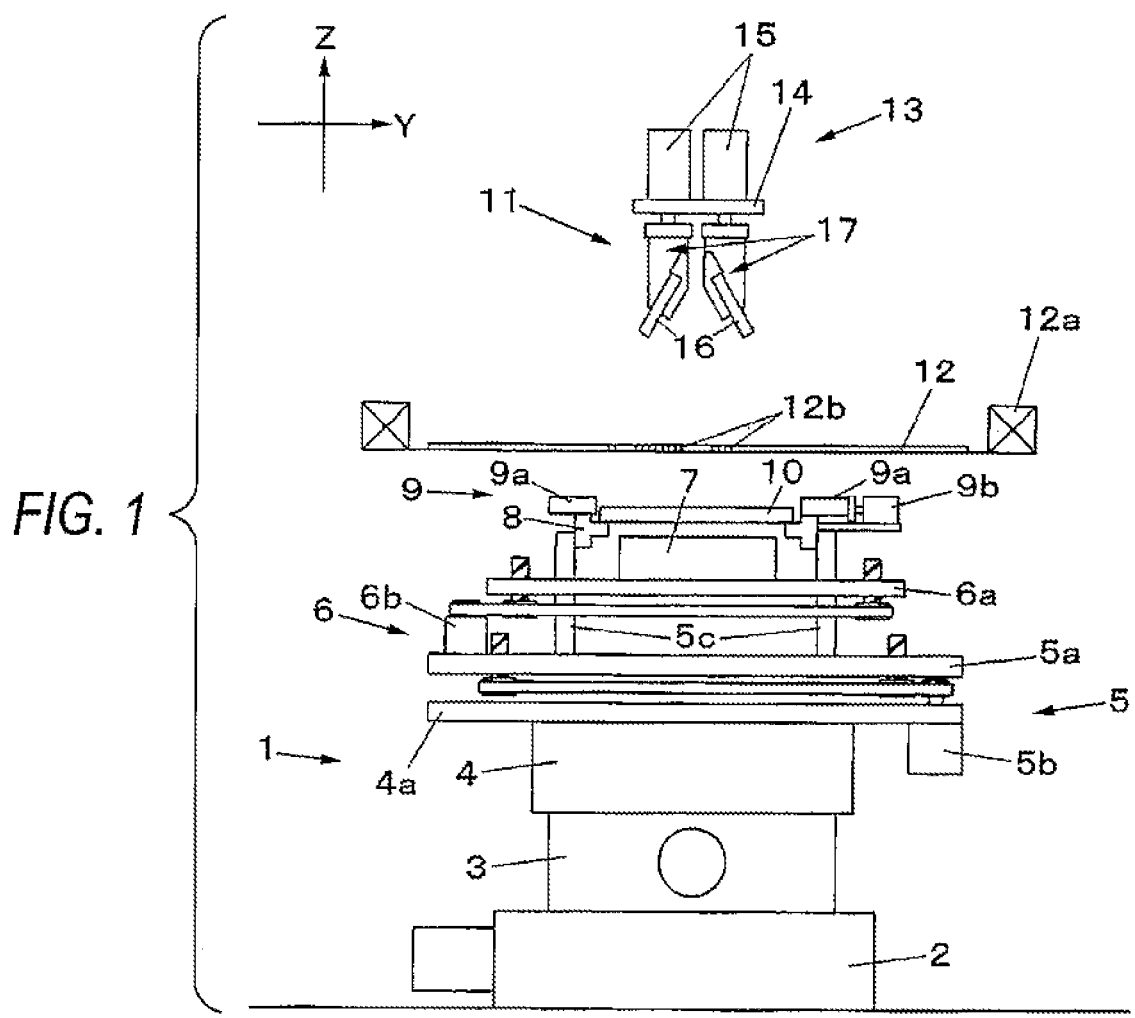
FIG. 1 is a side view of a screen printer of an embodiment of the present invention.

An embodiment of the present invention is now described by reference to the drawings. First, a structure of a screen printer is described by reference to FIGS. 1, 2, 3(a), and 3(b). In FIG. 1, the screen printer is made up of a substrate positioning section 1 and a screen printing mechanism 11 placed above the substrate positioning section 1. The substrate positioning section 1 is assembled by placing, one on top of the other and in order from the bottom, a Y-axis table 2, an X-axis table 3, and a O-axis table 4 in combination with a first Z-axis table 5 and a second Z-axis table 6 to be additionally placed in this order on the O-axis table 4.

A configuration of the first Z-axis table 5 is described. A horizontal base plate 5a is held in a vertically movable manner, by an elevation guide mechanism (omitted from the drawings), on an upper surface side of a similarly horizontal base plate 4a put on an upper surface of the O-axis table 4. The base plate 5a is moved up and down by means of a Z-axis elevation mechanism that is configured so as to rotationally actuate a plurality of feed screws 5c by way of a belt 5d with a motor 5b.

Figure 2:
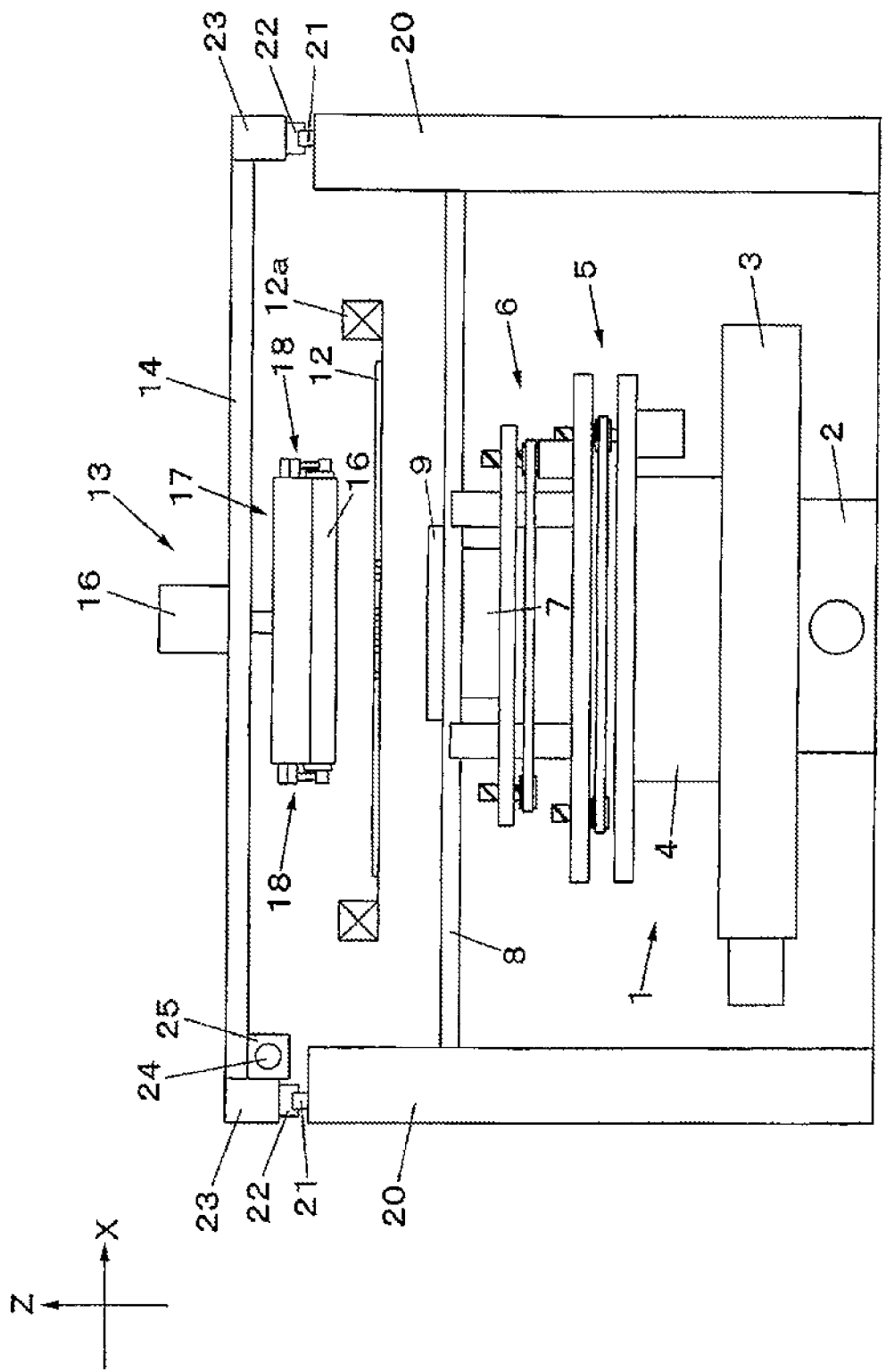
FIG. 2 is a front view of the screen printer of the embodiment of the present invention.
Figure 3:
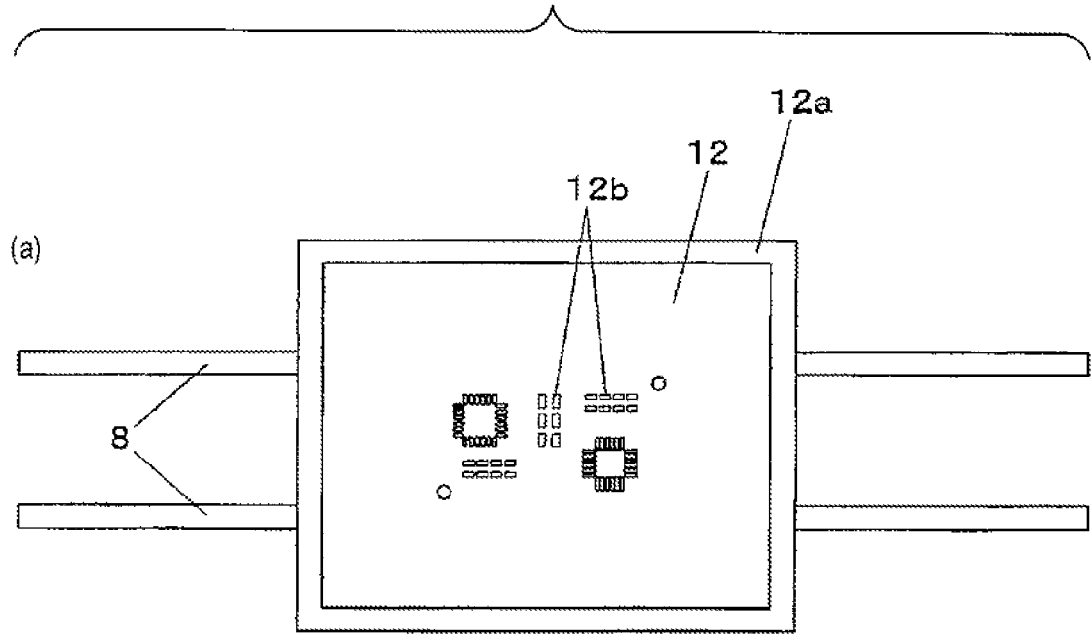
FIGS. 3 (a) and (b) are plan views of the screen printer of the embodiment of the present invention.
Figure 3:
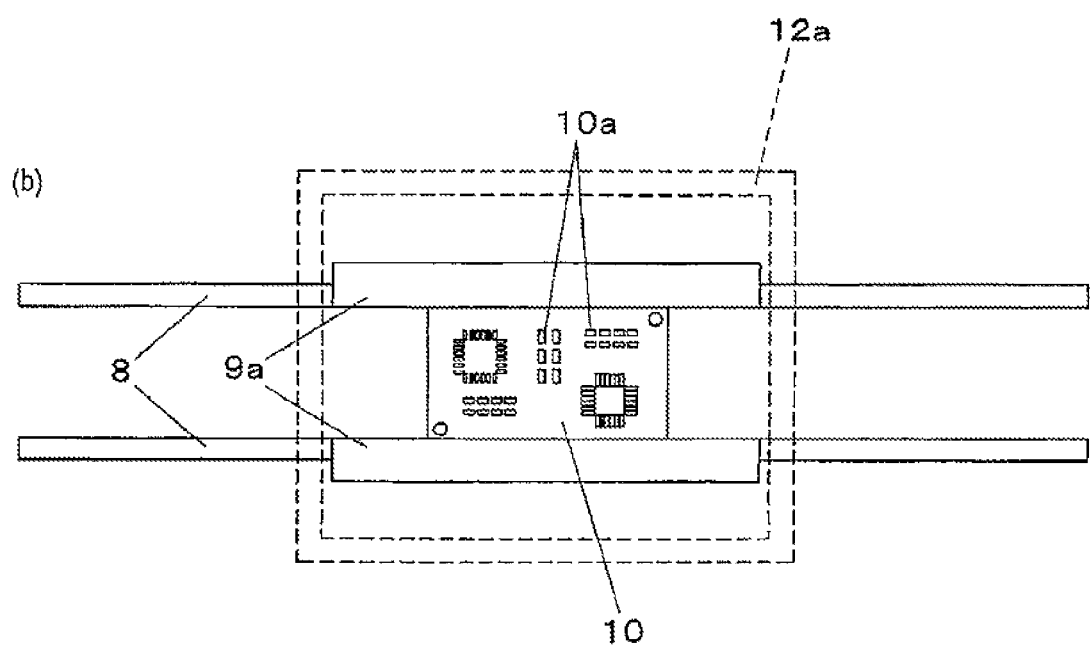

Vertical frames 5e stand upright on the base plate 5a, and a substrate conveyance mechanism 8 is held at upper ends of the vertical frames 5e. The substrate conveyance mechanism 8 has two rows of conveyance rails laid in parallel to each other along a direction in which a substrate is conveyed (a direction X: a direction perpendicular to a drawing sheet in FIG. 1). A substrate 10 that is a print target is conveyed while both sides of the substrate are supported by the conveyance rails. By means of moving the first Z-axis table 5, the substrate 10 held by the substrate conveyance mechanism 8 can be moved up and down with respect to the screen printing mechanism 11 along with the substrate conveyance mechanism 8. As shown in FIG. 2 and FIGS. 3(a) and (b), the substrate conveyance mechanism 8 has a stretch in both an upstream side (left sides in FIG. 2 and FIGS. 3(a) and (b)) and a downstream side. The substrate 10 conveyed from the upstream side is conveyed by the substrate conveyance mechanism 8 and further positioned by means of the substrate positioning section 1. The substrate 10 printed by the screen printing mechanism 11 is conveyed downstream by means of the substrate conveyance mechanism 8.

A configuration of the second Z-axis table 6 is now described. Between the substrate conveyance mechanism 8 and the base plate 5a is interposed a horizontal base plate 6a so as to be capable of vertical elevation along the elevation guide mechanism (omitted from the drawings). The base plate 6a moves up and down by means of the Z-axis elevation mechanism that is configured so as to rotationally actuate a plurality of feed screws 6c by way of a belt 6d with a motor 6b. A substrate lower support section 7 whose upper surface acts as a lower support surface for holding the substrate 10 is placed on an upper surface of the base plate 6a.

By means of movement of the second Z-axis table 6, the substrate lower support section 7 moves up and down with respect to the substrate 10 held by the substrate conveyance mechanism 8. As a result of the lower support surface of the substrate lower support section 7 contacting a lower surface of the substrate 10, the substrate lower support section 7 comes to support the substrate 10 from its lower surface side. A clamp mechanism 9 is placed on an upper surface of the substrate conveyance mechanism 8. The clamp mechanism 9 has two clamping members 9a disposed on right and left sides so as to oppose each other. The substrate 10 is fixedly clamped from both sides by causing one clamping member 9a to move forward or backward by means of a drive mechanism 9b.

The screen printing mechanism 11 placed at a position above the substrate positioning section 1 is now described. In FIGS. 1 and 2, a screen mask 12 is extended over a mask frame 12a. Pattern holes 12b are formed in the screen mask 12 in conformity with shapes and positions (see FIGS. 3(a) and (b)) of electrodes 10a of the substrate 10 that are to be print targets. A squeegee head 13 is placed above the screen mask 12. The squeegee head 13 has a configuration in which a horizontal moving plate 14 is equipped with squeegee elevation mechanisms 15 that vertically move respective squeegees 16 held by squeegee holders 17. The squeegees 16 move up and down along with the squeegee holders 17 by activating the squeegee elevation mechanisms 15, to thus contact an upper surface of the screen mask 12. In the squeegee head 13, effluence prevention mechanisms 18 for preventing cream solder from flowing outside are provided one on one lateral end of each of the squeegee holders 17.

As shown in FIG. 2, each of guide rails 21 is laid on top of each of vertical frames 20 along direction Y. Each of sliders 22 slidably fitted to the corresponding guide rail 21 is joined to each end of the moving plate 14 by way of a joint member 23. The squeegee head 13 thereby becomes slidably in the direction Y. The moving plate 14 is horizontally moved along the direction Y with squeegee moving means, each of which is made up of a nut 25, a feed screw 24, and a squeegee moving motor (omitted from the drawings) that rotationally actuates the feed screw 24.

Figure 4:
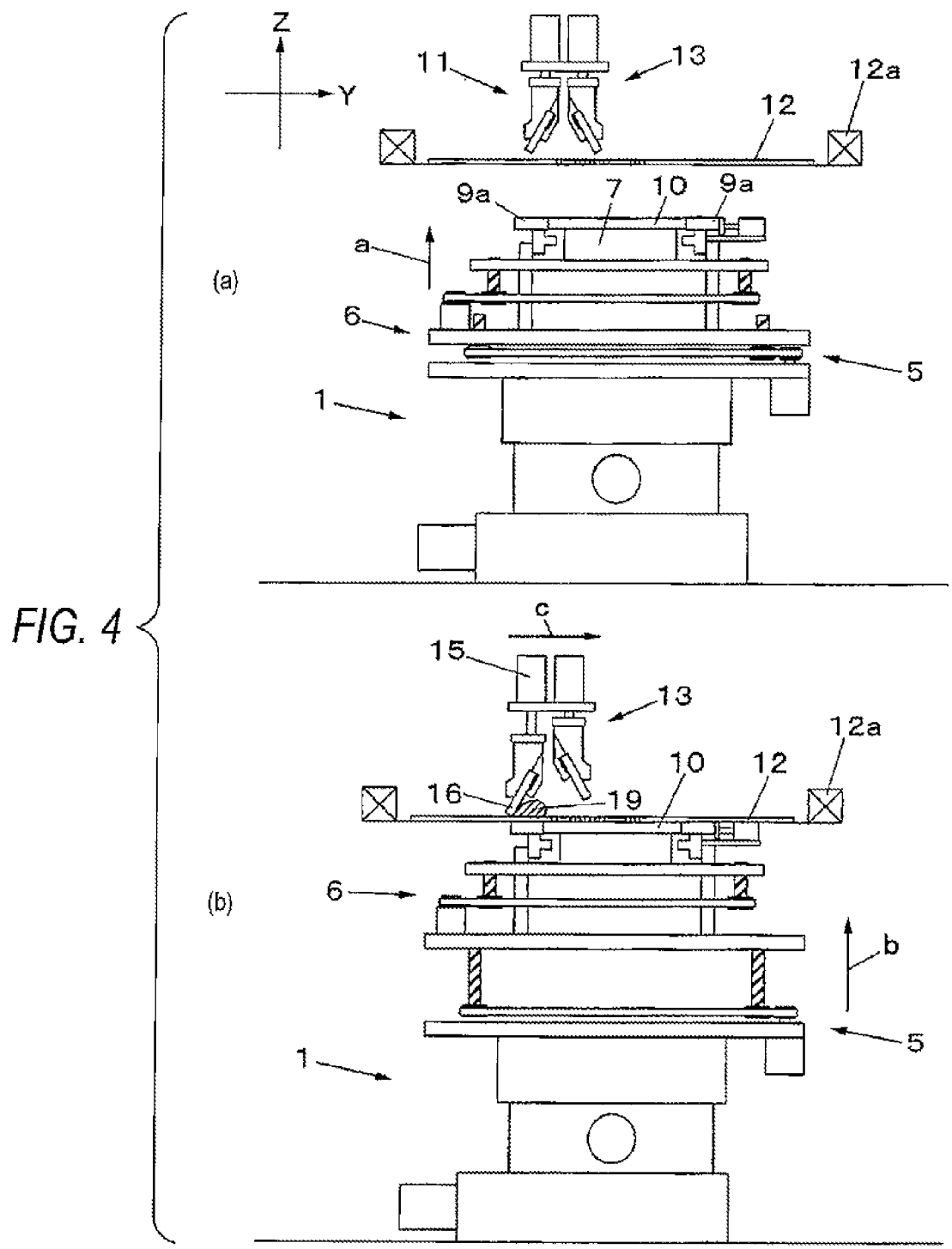
FIGS. 4 (a) and (b) are descriptive views of operation of the screen printer of the embodiment of the present invention.

Printing operation performed by the screen printing mechanism 11 is now described by reference to FIGS. 4(a) and (b). First, when the substrate 10 is conveyed to a print position with the substrate conveyance mechanism 8, the second Z-axis table 6 is moved, to thus upwardly move the substrate lower support section 7 (as indicated by arrow "a") to support the lower surface of the substrate 10 from below as shown in FIG. 4(a). The substrate 10 is clamped with and sandwiched between the clamping members 9a. The substrate positioning section 1 is moved in this state, thereby positioning the substrate 10 with respect to the screen mask 12.

Subsequently, as shown in FIG. 4(b), the first Z-axis table 5 is moved, to thus move the substrate 10 up (ad indicated by arrow "b") along with the substrate conveyance mechanism 8 and bring the substrate 10 into contact with the lower surface of the screen mask 12. During squeegeeing operation performed by the squeegee head 13, the substrate 10 is thereby fixedly positioned with respect to the screen mask 12. In this state, the squeegees 16 are slid over the screen mask 12 (as indicated by arrow "c") supplied with cream solder 19 that is paste, whereby the substrate 10 is printed with the cream solder 19 through the pattern holes 12b.

By reference to FIGS. 5(a) and (b). FIGS. 6(a) and (b), and FIGS. 7(a) and (b), explanations are now given to a detailed configuration of the squeegee head 13 and a configuration and function of the effluence prevention mechanism 18 provided on both lateral end faces of the squeegee head 13. Each of the effluence prevention mechanisms 18 has a function of preventing the cream solder 19 from flowing outside each of the squeegees 16 during squeegeeing operation shown in FIG. 4(b). In order to fulfill the function, each of the effluence prevention mechanisms 18 has a dam member 30 and a pressing mechanism. The dam members 30 are placed on the squeegee head 13 while spaced apart from each other at an interval according to a print width of the substrate 10 in a direction in which the squeegees 16 proceed during squeegeeing operation. Each of the dam members 30 contacts an upper surface of the screen mask 12 and the squeegees 16, thereby preventing the cream solder 19 on the screen mask 12 from flowing outside the print width. Each of the pressing mechanisms presses the corresponding dam member 30 against the screen mask 12. In order to make descriptions of the structure simple, FIGS. 6(*a*) and (*b*) individually illustrate the effluence prevention mechanism 18 partially cut out of the squeegee holder 17.

Figure 5:
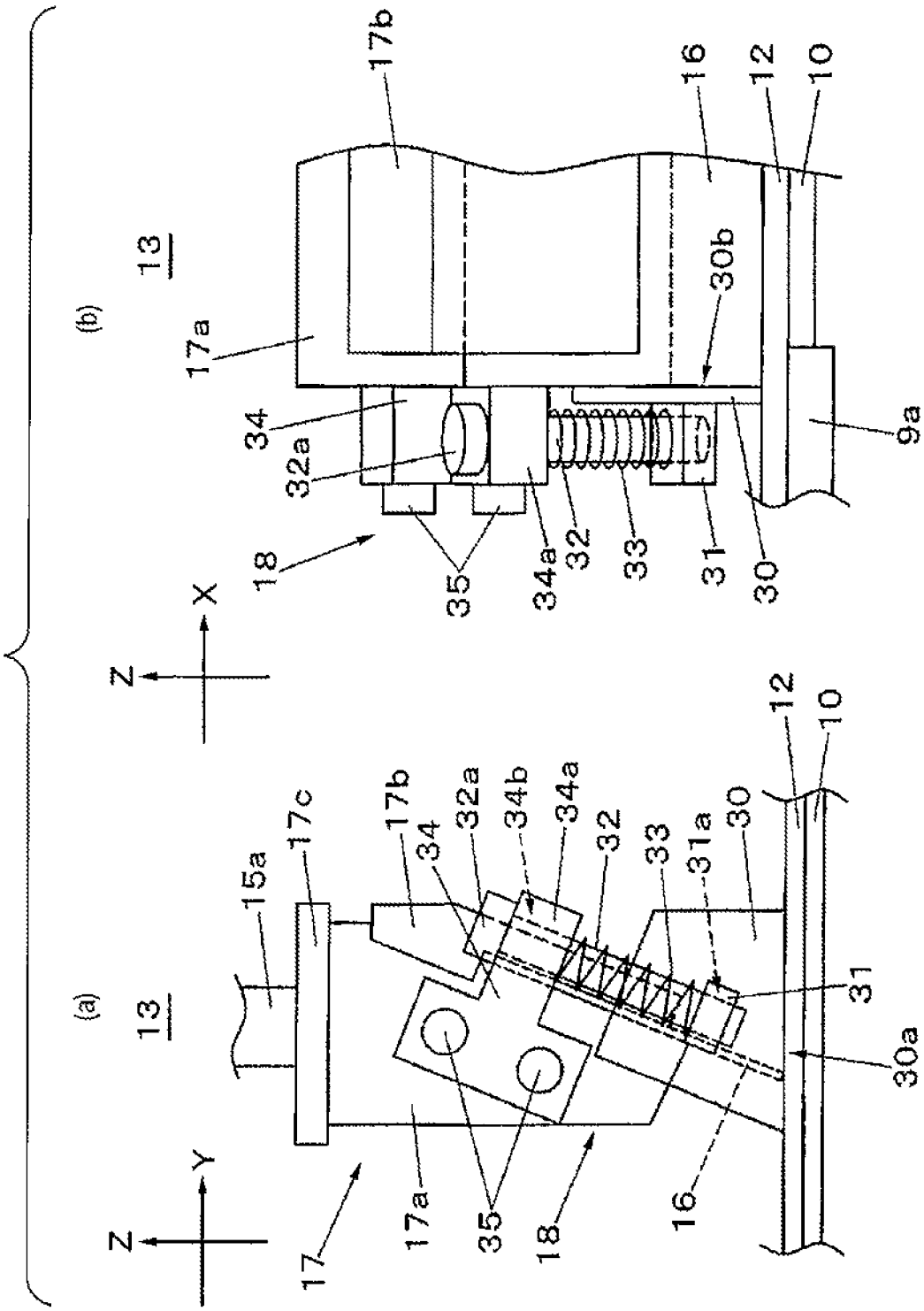
FIGS. 5 (a) and (b) are descriptive views of a configuration of a dam mechanism in the screen printer of the embodiment of the present invention.
Figure 6:
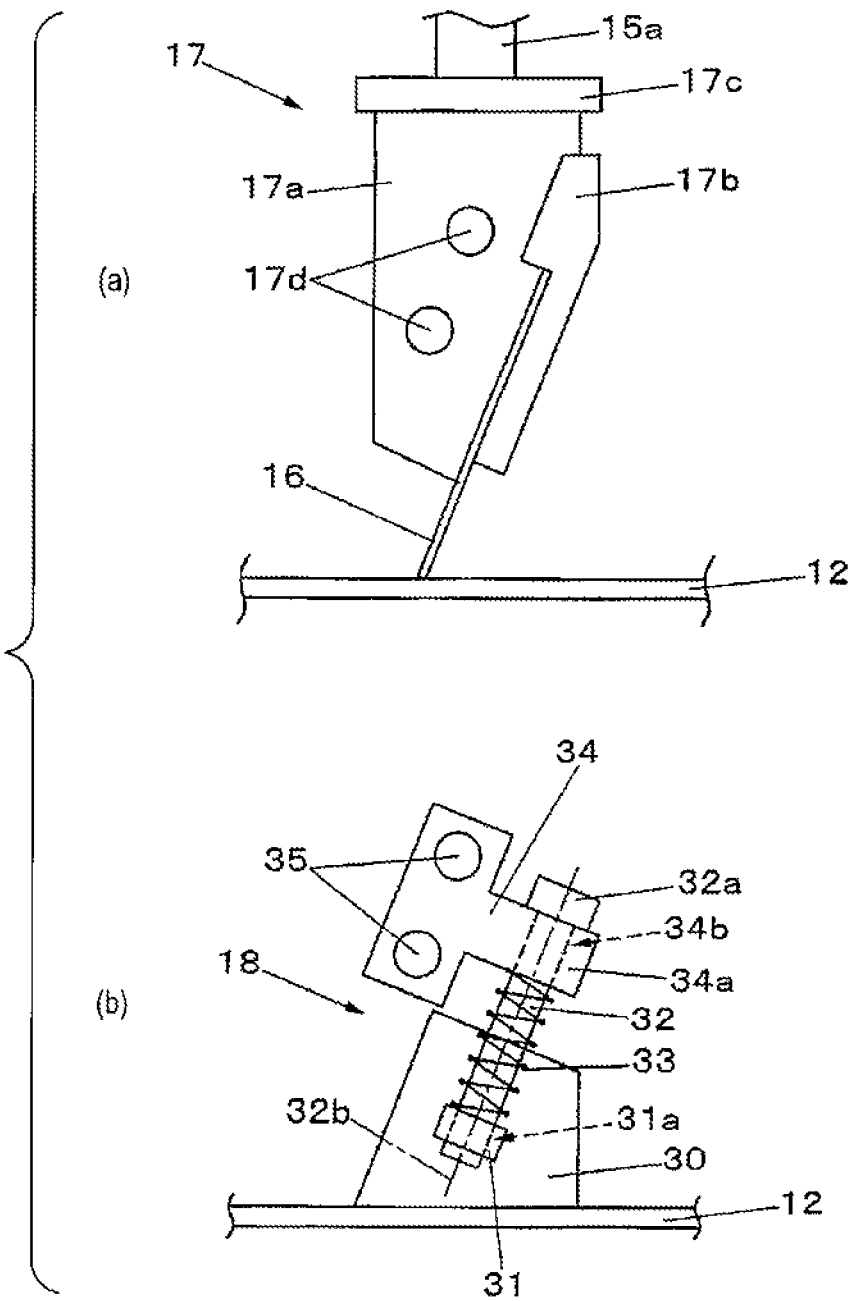
FIGS. 6 (a) and (b) are descriptive views of the configuration of the dam mechanism in the screen printer of the embodiment of the present invention.

As shown in FIG. 5(*a*) and FIG. 6(*a*), the squeegee head 13 is configured such that each of the plate-like squeegees 16 is held by way of the corresponding squeegee holder 17, while inclined in a squeegeeing direction (the direction Y), with an elevation drive shaft 15*a* that downwardly extends from the squeegee elevation mechanism 15. Each of the squeegee holders 17 is joined to the elevation drive shaft 15*a* by way of a joint member 17*c*. The plate-like squeegee 16 is fixed, while being sandwiched, between a holder base 17*a* and a nipping member 17*b* placed on a front surface of the holder base 17*a*. Each of the squeegees 16 is fabricated so as to assume a width, which is equal to the print width of the substrate 10, in direction X. Further, the effluence prevention mechanisms 18 to be described later are spaced apart from each other at a interval according to the print width of the substrate 10.

A configuration of the effluence prevention mechanisms 18 is now described. Mount bolts 35 are screw-engaged with fastening holes 17*d* opened in each of the holder bases 17*a*, whereby a holding bracket 34 is fixedly fastened to a lateral surface of each of the holder bases 17*a* while a guide fixing section 34*a* remains extended in the squeegeeing direction. A guide shaft 32 is fixedly inserted into an attachment hole 34*b* formed in each of the guide fixing sections 34*a* while a head portion 32*a* projects upward. A lower portion of the guide shaft 32 is fitted, so as to be slidably in the axial direction, to a slide hole 31*a* of a slide block 31 fixed to each of the dam members 30.

The guide shaft 32 is further inserted into a compression spring 33 interposed between the guide fixing section 34*a* and the slide block 31. The slide block 31 and the dam member 30 are thereby forced downwardly by dint of restoring force of the compression spring 33 while guided by the guide shaft 32. The dam member 30 is then pressed against the upper surface of the screen mask 12. Moreover, as shown in FIG. 5(*b*), the effluence prevention mechanism 18 is placed such that a side surface 30*b* of each of the dam members 30 contacts a lateral end face of each of the squeegees 16 at all times.

As shown in FIG. 6(*b*), the guide shaft 32 is placed in such a way that an axial center line 32*b* is in parallel to the squeegee 16 held by the corresponding squeegee holder 17. When pressed by the compression spring 33, the dam member 30 moves in a direction parallel to the squeegee 16 at all times. Specifically, the pressing mechanism that makes up the effluence prevention mechanism 18 has the guide shaft 32 that is placed in parallel to the squeegee 16 and that guides a direction of movement of the dam member 30 during pressing action and the compression spring 33 that is forcing unit for forcing the dam member 30 in the axial direction of the guide shaft 32.

Figure 7:
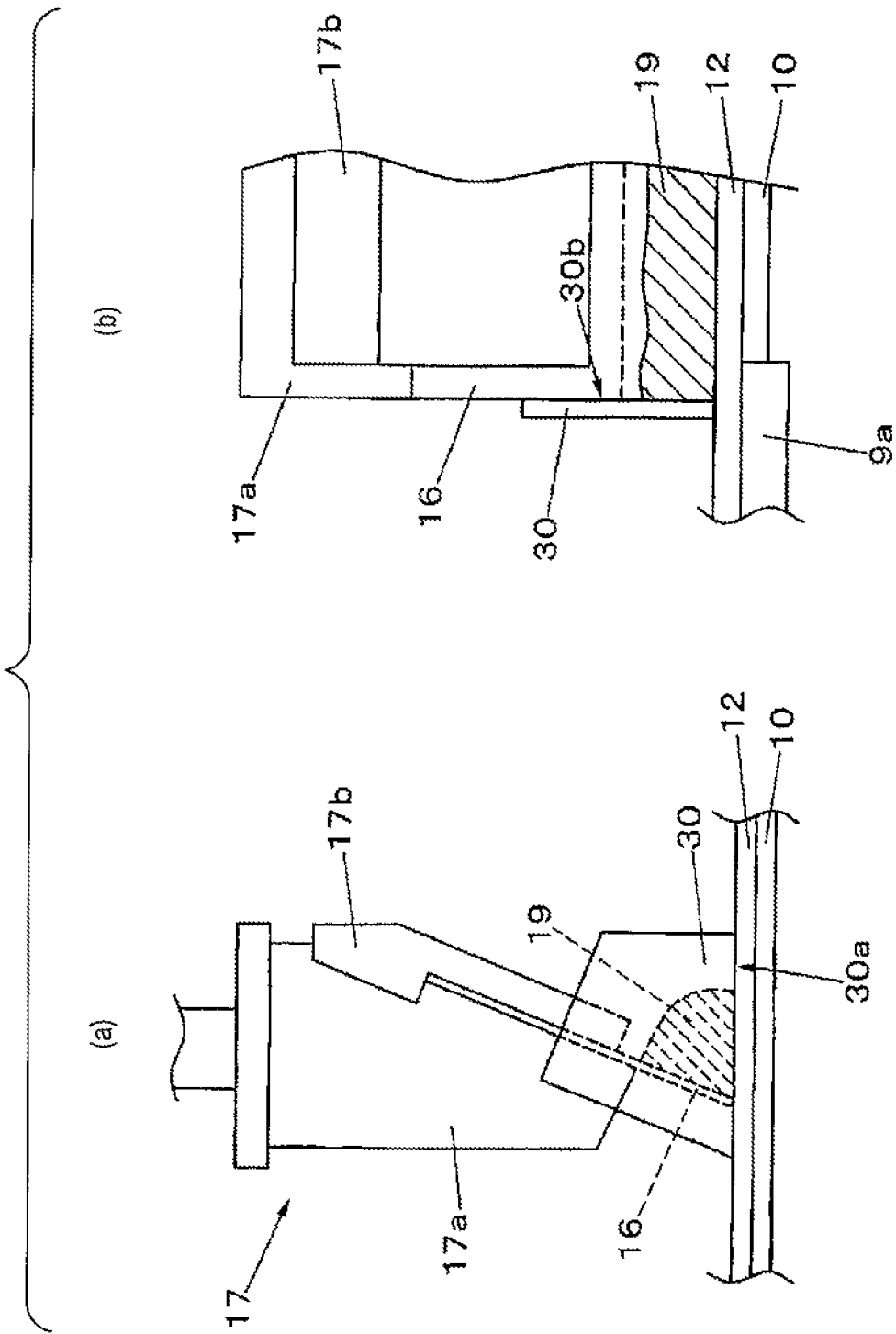
FIGS. 7 (a) and (b) are descriptive views of a function of the dam mechanism in the screen printer of the embodiment of the present invention.

FIGS. 7(*a*) and (*b*) show function of the dam member 30 that is exhibited during squeegeeing operation performed by the squeegee head 13. Specifically, the cream solder 19 is scraped up in the direction of movement of the squeegee 16 in a course of repetition of squeegeeing operation, and the thus-scraped cream solder is gradually shoved outside along the surface of the squeegee 16. Even in such a case, the squeegee head 13 with the foregoing structure has the dam member 30. Consequently, a lower end face 30*a* contacts the upper surface of the screen mask 12, and the side surface 30*b* contacts the lateral end face of the squeegee 16, thereby preventing effluence of the cream solder 19 to the outside during squeegeeing operation.

FIGS. 5(*a*) and (*b*), FIGS. 6(*a*) and (*b*), and FIGS. 7(*a*) and (*b*) show examples in which the effluence prevention mechanism 18 is attached to either lateral end of each of the squeegee holders 17 that hold the squeegees 16. However, as in the case with an effluence prevention mechanism 18A shown in FIGS. 8(*a*) and (*b*) and FIGS. 9(*a*) and (*b*), there can also be adopted a configuration in which the dam member 30 is provided so as to be movable in a widthwise direction of the squeegee 16. In order to make explanations about the structure simple, FIGS. 8(*a*) and (*b*) separately show the effluence prevention mechanism 18A partially cut out of the squeegee holder 17.

Figure 8:
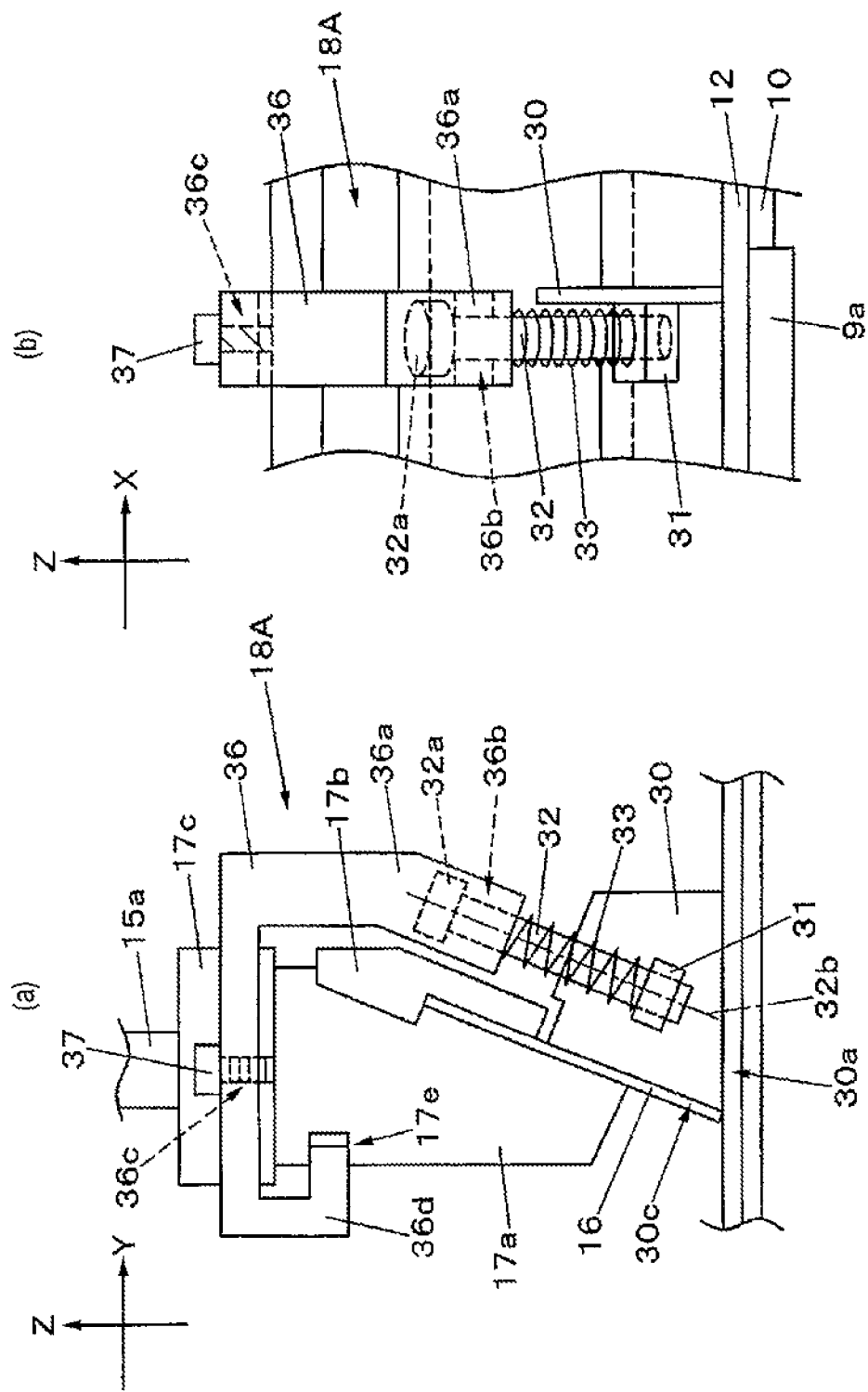
FIGS. 8 (a) and (b) are descriptive views of the configuration of the dam mechanism in the screen printer of the embodiment of the present invention.
Figure 9:
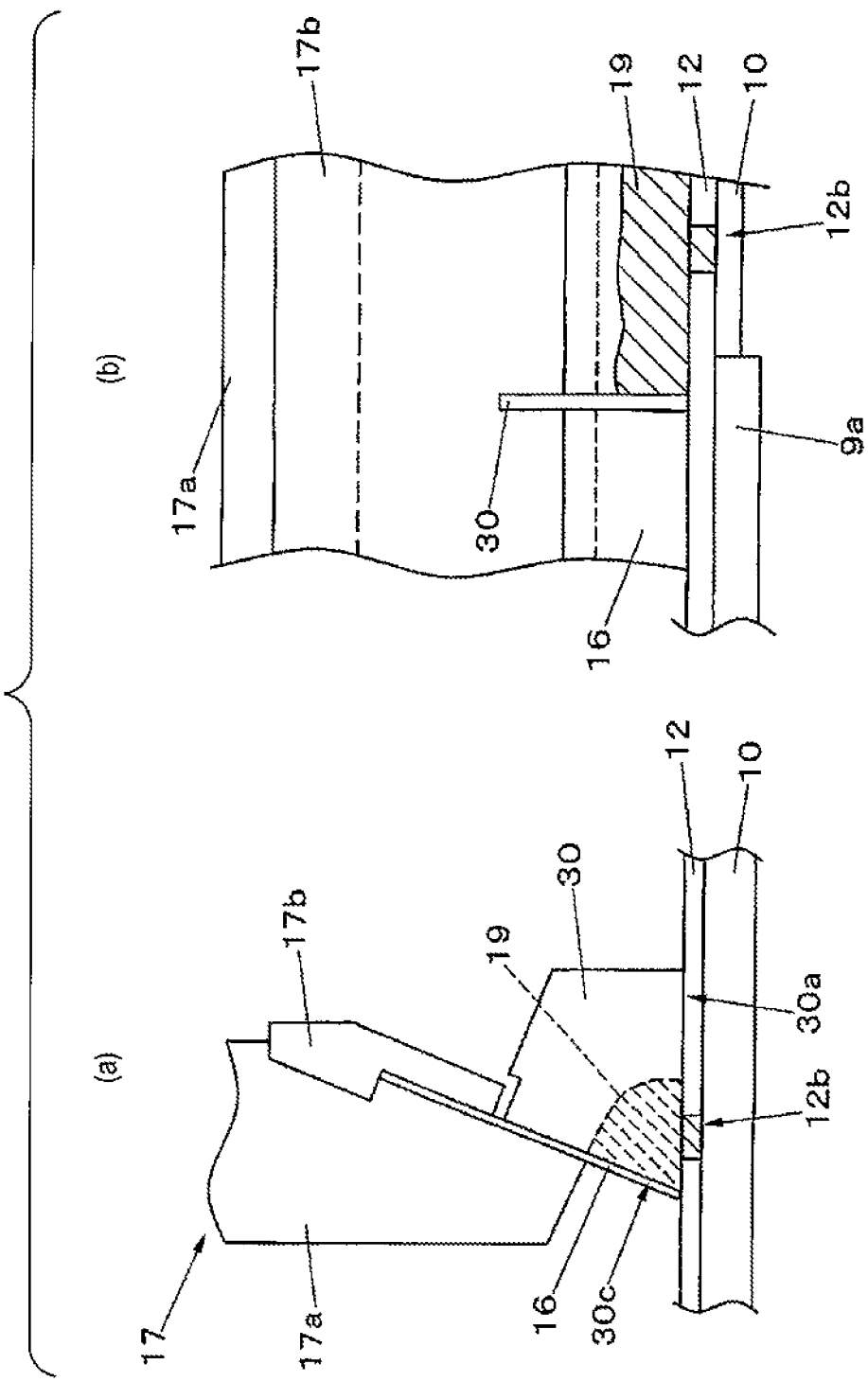
FIGS. 9 (a) and (b) are descriptive views of the function of the dam mechanism in the screen printer of the embodiment of the present invention.

The structure for holding the squeegees 16 with the squeegee holders 17 shown in FIGS. 8(*a*) and 9(*a*) is analogous to the structure shown in FIGS. 5(*a*) and 6(*a*). A substantiall-7-shaped holding bracket 36 is provided at a position above the squeegee holder 17 so as to be movable in the direction X with respect to the squeegee holder 17. The holding bracket 36 has a guide fixing section 36*a* extended in a squeegeeing direction. The guide shaft 32 similar to that of the examples shown in FIGS. 5(*a*) and 6(*a*) is fixedly inserted into an attachment hole 36*b* formed in the guide fixing section 36*a* such that the head portion 32*a* projects upward. A lower portion of the guide shaft 32 is fitted, in a slidable manner, to the slide hole 31*a* of the slide block 31 fixed to the dam member 30.

Further, the guide shaft 32 is inserted into the compression spring 33 interposed between the guide fixing section 34*a* and the slide block 31. The slide block 31 and the dam member 30 are thereby forced downward by dint of restoring force of the compression spring 33 while guided by the guide shaft 32. The dam member 30 is pressed against the upper surface of the screen mask 12. As shown in FIG. 8(*a*), a lateral end face 30*c* of the dam member 30 is arranged so as to contact the front surface of the squeegee 16 in the squeegeeing direction at all times.

As shown in FIG. 8(*a*), the guide shaft 32 is positioned in such a way that the axial center line 32*b* becomes parallel to the squeegee 16 held by the squeegee holder 17. During pressing effected by the compression spring 33, the dam member 30 moves in a direction parallel to the squeegee 16 at all times. Specifically, the pressing mechanism that makes up the effluence prevention mechanism 18A includes the guide shaft 32 that is placed in parallel to the squeegee 16 and that guides the direction of movement of the dam member 30 performed during pressing operation and the compression spring 33 serving as forcing unit that forces the dam member 30 in the axial direction of the guide shaft 32.

In the effluence prevention mechanism 18A shown in FIGS. 8(*a*) and (*b*), the position of the dam member 30 can be changed in the direction X so that the squeegee 16 and the corresponding squeegee holder 17 that each have a single width can be applied to a plurality of types of substrates 10 with different print widths. Specifically, an engagement section 36*d* provided on a left end of the holding bracket 36 is engaged with an engagement groove 17*e* horizontally formed in the left lateral surface of the holder base 17*a* in its longitudinal direction. The engagement section 36*d* is slid along the engagement groove 17*e*, whereby the position of the dam member 30 of the effluence prevention mechanism 18A achieved in the direction X can be moved. A clamp bolt 37 fastened to a clamp hole 36*c* formed in an upper portion of the holding bracket 36 is fastened, whereby the holding bracket 36 is fixed to the holder base 17a in this state. The position of the dam member 30 is fixed.

FIGS. 9(a) and (b) show a function of the dam member 30 that is exhibited during squeegeeing operation. Specifically, in the course of repetition of squeegeeing operation, the cream solder 19 is gradually shoved outside along the surface of the squeegee 16 in the same way as that shown in FIGS. 7(a) and (b). However, the lower end face 30a of the dam member 30 contacts the upper surface of the screen mask 12, and the lateral end face 30c contacts the front surface of the squeegee 16 in the squeegeeing direction, thereby preventing outward effluence of the cream solder 19, which would otherwise occur during squeegeeing operation.

In each of the effluence prevention mechanisms 18 and 18A, the pressing mechanism that presses against the screen mask 12 the dam member 30 which prevents the cream solder 19 on the screen mask 12 from draining outside the print width is configured so as to include the guide shaft 32 and the compression spring 33. The guide shaft 32 is placed in parallel to the corresponding squeegee 16 and guides a direction of movement of the same member 30 during pressing operation. The compression spring 33 forces the dam member 30 in the axial direction of the guide shaft 32. The restoring force of the compression spring 33 can thereby be caused to act as press force for pressing the dam member 30 against the screen mask 12 rather than acting on the squeegee 16.

Therefore, problems of a method for pressing dam members that have been provided for the same purpose in the related art solved. More specifically, in a configuration in which the dam members are separately forced with two compression springs that are placed in the vertical direction with respect to the squeegee and in mutually orthogonal directions with respect to the upper surface of the screen mask, a printing pressure value at which the squeegees presses the screen mask during screen printing varies under influence of restoring force vertically acting on the squeegees, and an effect of preventing occurrence of a runoff of paste becomes unstable. These problems are solved.

The patent application is based on Japanese Patent Application (JP-2011-275406) filed on Dec. 16, 2011, the subject matter of which is incorporated herein by reference in its entirety.

INDUSTRIAL APPLICABILITY

The screen printer of the present invention yields an advantage of the ability to make stable an effect of preventing paste on a screen mask from draining outside a print width. The screen printer is useful in a field where paste, such as cream solder, is printed on the substrate.

DESCRIPTIONS OF THE REFERENCE NUMERALS AND SYMBOLS

1 SUBSTRATE POSITIONING SECTION
10 SUBSTRATE
11 SCREEN PRINTING MECHANISM
12 SCREEN MASK
12b PATTERN HOLE
13 SQUEEGEE HEAD
15 SQUEEGEE ELEVATION MECHANISM
16 SQUEEGEE
17 SQUEEGEE HOLDER
18, 18A EFFLUENCE PREVENTION MECHANISM
19 CREAM SOLDER (PASTE)
30 DAM MEMBER
32 GUIDE SHAFT
33 COMPRESSION SPRING (FORCING UNIT)

The invention claimed is:

1. A screen printer that brings a substrate into contact with a screen mask having a pattern hole and prints the substrate with paste through the pattern hole by squeegeeing operation for supplying the paste over the screen mask and sliding a squeegee, the screen printer comprising:
    a substrate positioning section that holds and positions the substrate with respect to the screen mask;
    a screen printing mechanism that vertically and horizontally moves a squeegee head having the squeegee and a squeegee holder that holds the squeegee. thereby performing the squeegeeing operation; and
    a dam member that is provided on the squeegee head extending in a direction in which the squeegee proceeds during the squeegeeing operation and that contacts an upper surface of the screen mask and the squeegee, thereby preventing effluence of the paste to the outside of the print width on the screen mask; and
    a pressing mechanism that presses the dam member against the screen mask, the pressing mechanism including a holding bracket and an engagement section provided on an end of the holding bracket and being engaged with an engagement groove horizontally formed in a longitudinal direction at a lateral surface of the squeegee holder,
    wherein the pressing mechanism has a guide shaft which has an axial center line in parallel to the squeegee and guides a direction of movement of the dam member during pressing operation and a forcing unit that forces the dam member in an axial direction of the guide shaft,
    wherein the axial center line of the guide shaft and the squeegee in parallel to each other are inclined with respect to a vertical plane which is orthogonal to the screen mask.

2. The screen printer according to claim 1 further comprising a second dam member provided on the squeegee head, wherein the dam member and the second dam member are provided at an interval according to a print width of the substrate.

3. The screen printer according to claim 1, wherein the squeegee head includes a squeegee holder that holds the squeegee in an inclined state.

4. The screen printer according to claim 3, wherein the pressing mechanism further includes a holding bracket that holds the guide shaft in an inclined state, and the holding bracket is attached to the squeegee holder.

5. The screen printer according to claim 4 further comprising a second dam member provided on the squeegee head, wherein the dam member and the second dam member are provided at an interval according to a print width of the substrate, and
    the holding bracket is provided to move at least one of the dam member and the second dam member to vary the interval according to the print width of the substrate.

* * * * *